United States Patent
Kozuma et al.

(10) Patent No.: US 10,778,096 B2
(45) Date of Patent: Sep. 15, 2020

(54) CURRENT DETECTION CIRCUIT AND POWER SUPPLY DEVICE

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi (JP)

(72) Inventors: Kentaro Kozuma, Mie (JP); Yuuki Sugisawa, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 16/449,848

(22) Filed: Jun. 24, 2019

(65) Prior Publication Data
US 2019/0393780 A1    Dec. 26, 2019

(30) Foreign Application Priority Data
Jun. 25, 2018 (JP) .................. 2018-119617

(51) Int. Cl.
*H02M 3/156* (2006.01)
*H02M 1/00* (2006.01)

(52) U.S. Cl.
CPC .... *H02M 3/156* (2013.01); *H02M 2001/0009* (2013.01)

(58) Field of Classification Search
CPC ........... H02M 2001/0009; H02M 3/00; H02M 3/155–1588
See application file for complete search history.

(56) References Cited

U.S. PATENT DOCUMENTS

| | | | | |
|---|---|---|---|---|
| 4,599,610 A * | 7/1986 | Lacy | ........................ | G09G 1/16 |
| | | | | 345/636 |
| 2012/0092732 A1* | 4/2012 | Nakazawa | ......... | H04N 1/00928 |
| | | | | 358/474 |
| 2013/0328540 A1* | 12/2013 | Kung | .................... | H02M 3/158 |
| | | | | 323/311 |
| 2014/0354211 A1* | 12/2014 | Zottola | .................... | H02J 7/35 |
| | | | | 320/101 |

FOREIGN PATENT DOCUMENTS

JP          H9-119949 A    5/1997

* cited by examiner

*Primary Examiner* — Thienvu V Tran
*Assistant Examiner* — Peter M Novak
(74) *Attorney, Agent, or Firm* — Honigman LLP (57) ABSTRACT

It is an object of the present disclosure to reduce the number of constituent components and accurately detect a current. A current detection circuit detects a current flowing through a DC/DC converter. A first output unit applies, to a third signal path, a voltage that corresponds to an output from a detection sensor, which has detected a larger current, out of a first sensor and a second sensor. Furthermore, the first output unit applies, to the third signal path, a voltage obtained by reflecting a voltage drop at the transistor or the transistor that is connected to the detection sensor, in the voltage output from the detection sensor. A second output unit applies, to a fourth signal path, a voltage obtained by reflecting a voltage drop that occurs between a base and an emitter of a transistor, in the voltage applied to the third signal path.

7 Claims, 6 Drawing Sheets

CURRENT DETECTION CIRCUIT AND POWER SUPPLY DEVICE

CROSS-REFERENCE TO RELATED APPLICATIONS

This application claims priority of Japanese Patent Application No. JP 2018-119617 filed on Jun. 25, 2018, the contents of which are incorporated herein.

TECHNICAL FIELD

The present disclosure relates to a current detection circuit and a power supply device.

BACKGROUND

On-board power supply devices employ a DC/DC converter that converts, by stepping-up or stepping-down, a DC voltage into a desired DC voltage. Such a DC/DC converter is required to be able to accurately detect the magnitudes of electric currents flowing through input-side and output-side conduction paths. For example, JP H09-119949A discloses an overcurrent detection circuit having a configuration in which an input voltage for a load device is divided at a diode and a voltage-dividing resistor, and a resultant voltage is applied as a base bias to the base of a transistor. If an overcurrent flows through a power supply path and a voltage across terminals of a current-detecting resistor is larger than a voltage across terminals of the voltage-dividing resistor, the transistor is biased in a forward direction and is turned on, thereby transmitting an overcurrent detection signal to a power supply device.

JP H09-119949A is an example of related art.

Figure 5:
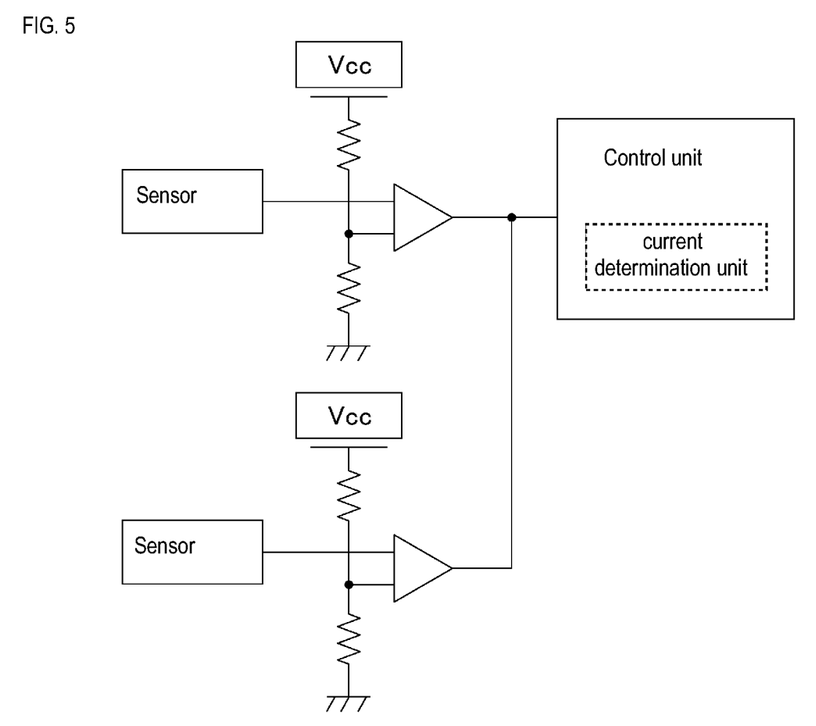
FIG. 5 is a circuit diagram schematically illustrating an example of a configuration of a current detection circuit according to a conventional example.

However, in the configuration of JP H09-119949A, if detecting currents at a plurality of positions within the circuit is desired, a plurality of current detection circuits having the same configuration above need to be provided. Specifically, if detecting currents flowing through an input-side conduction path and an output-side conduction path of a DC/DC converter is desired, one current detection circuit for each conduction path, namely, two current detection circuits, are required. For example, if, as shown in FIG. 5, it is desired that currents be detected based on signals output from sensors respectively provided on different conduction paths, one current detection circuit (a circuit including a resistor, a comparator, and the like) that corresponds to each of the sensors is required. This leads to the problem of an increase in the number of constituent components.

Figure 6:
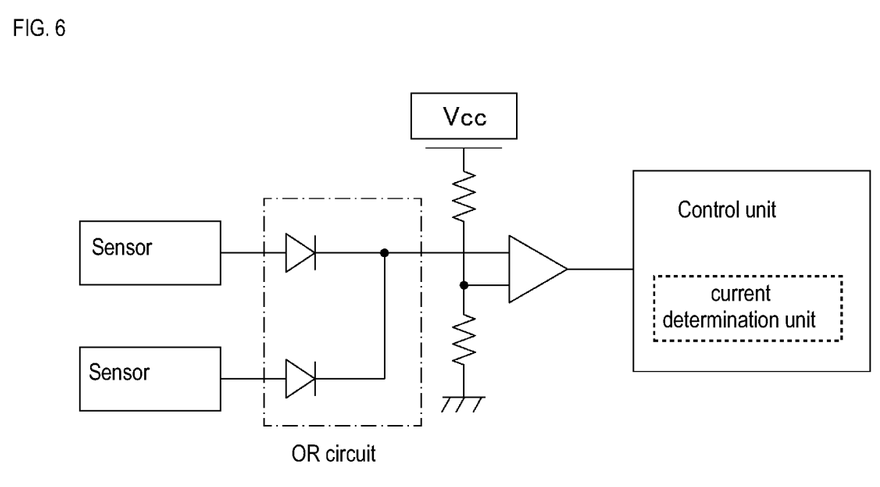
FIG. 6 is a circuit diagram schematically illustrating an example of a configuration of a current detection circuit according to a conventional example.

To solve this problem, it is conceivable to provide a current detection circuit, as shown in FIG. 6, that is partially shared by conduction paths, with a configuration having an OR circuit using diodes. However, due to the use of the diodes, a voltage drop will occur, and the diodes will have temperature characteristics. Accordingly, in a configuration in which the magnitudes (thresholds) of voltages to be detected are set based on voltage drops of the diodes, the thresholds may vary and the current detection accuracy may deteriorate.

SUMMARY

The present disclosure was made to solve at least one of the aforementioned problems, and it is an object thereof to provide a configuration with which the number of constituent components can be reduced, and a current can be accurately detected.

According to a first aspect of the present disclosure, a current detection circuit for detecting a current flowing through an on-board DC/DC converter electrically connected to a first conduction path and a second conduction path is provided. The DC/DC converter is configured to step-up or step-down a voltage applied to an input-side conduction path and output the resultant voltage to an output-side conduction path while taking one of the first conduction path and the second conduction path as the input-side conduction path and the other one as the output-side conduction path. The current detection circuit includes a first sensor configured to output a first voltage that corresponds to a current flowing through the first conduction path; a first signal path to which a voltage that corresponds to the first voltage is applied; a second sensor configured to output a second voltage that corresponds to a current flowing through the second conduction path; a second signal path to which a voltage that corresponds to the second voltage is applied. A first output unit is provided with a first element having a first input terminal connected to the first signal path, and a first output terminal; a second element having a second input terminal connected to the second signal path, and a second output terminal; and a third signal path connected to the first output terminal and the second output terminal, the first output unit is configured to apply, to the third signal path, a voltage that corresponds to an output from a detection sensor, which has detected a larger current, out of the first sensor and the second sensor. A second output unit is provided with a third element having a third input terminal connected to the third signal path, and a third output terminal; and a fourth signal path connected to the third output terminal, wherein the first output unit applies, to the third signal path, a voltage obtained by reflecting a voltage drop at the first element or the second element that is connected to the detection sensor, in the voltage output from the detection sensor, and the second output unit applies, to the fourth signal path, a voltage obtained by reflecting a voltage drop that occurs between the third input terminal and the third output terminal of the third element, in the voltage applied to the third signal path.

According to a second aspect of the present disclosure, a power supply device includes: the on-board DC/DC converter; and the above-described current detection circuit.

In the current detection circuit according to the first aspect, the first output unit applies, to the third signal path, a voltage that corresponds to an output from a detection sensor, which has detected a larger current, out of the first sensor and the second sensor. Accordingly, a voltage that corresponds to a current from the conduction path through which the larger current flows, out of the first conduction path and the second conduction path that are connected to the DC/DC converter, can be applied to the third signal path.

Also, the first output unit applies, to the third signal path, a voltage obtained by reflecting a voltage drop at the first element or the second element that is connected to the detection sensor, in the voltage output from the detection sensor. Furthermore, the second output unit applies, to the fourth signal path, a voltage obtained by reflecting a voltage drop that occurs between the third input terminal and the third output terminal of the third element, in the voltage applied to the third signal path. Accordingly, that portion of the voltage applied to the third input terminal that corresponds to a voltage drop at the first element or the second element can be cancelled out by a voltage drop at the third element. Thus, a current flowing through the first conduction path or the second conduction path can be detected based on a voltage applied to the fourth signal path, without being affected by a voltage drop that occurs at the element.

This current detection circuit can detect currents flowing in different directions through the first conduction path and the second conduction path connected to the on-board DC/DC converter, because the first sensor and the second sensor respectively detect the currents flowing through the first conduction path and the second conduction path. Accordingly, it is possible to reduce the number of constituent components, compared to a configuration in which separate current detection circuits are provided for the first conduction path and the second conduction path.

Moreover, a temperature change caused by a voltage drop that occurs at the first element or the second element can be cancelled out by a temperature change caused by a voltage drop that occurs at the third element. Accordingly, a current can be accurately detected, without being affected by the temperature characteristics of the first element or the second element.

With the power supply device according to the second aspect, the same effects as those of the current detection circuit according to the first aspect can be achieved.

DETAILED DESCRIPTION OF PREFERRED EMBODIMENTS

Hereinafter, preferred examples of the present disclosure will be described. Note however that the present disclosure is not limited to the following examples.

A first element, a first input terminal, and a first output terminal may be respectively configured as a bipolar transistor, a base, and an emitter. A second element, a second input terminal, and a second output terminal may be respectively configured as a bipolar transistor, a base, and an emitter. A third element, a third input terminal, and a third output terminal may be respectively configured as a bipolar transistor, a base, and an emitter.

In doing so, a change caused by a voltage drop due to the temperature characteristics of the first element or the second element configured as a bipolar transistor can be cancelled out by a voltage drop that occurs due to the temperature characteristics of the third element configured as a bipolar transistor. Accordingly, currents can be accurately detected without being affected by the temperature characteristics of the elements.

The first element, the first input terminal, and the first output terminal may also be respectively configured as a diode, an anode, and a cathode. The second element, the second input terminal, and the second output terminal may also be respectively configured as a diode, an anode, and a cathode. The third element, the third input terminal, and the third output terminal may also be respectively configured as a diode, a cathode, and an anode.

In doing so, a change caused by a voltage drop due to the temperature characteristics of the first element or the second element configured as a diode can be cancelled out by a voltage drop that occurs due to the temperature characteristics of the third element configured as a diode. Accordingly, currents can be accurately detected without being affected by the temperature characteristics of the elements.

A first voltage-dividing circuit that divides a first voltage applied by a first sensor, and a second voltage-dividing circuit that divides a second voltage applied by a second sensor may be provided. A voltage obtained by the voltage division of the first voltage-dividing circuit may be applied to the first input terminal, and a voltage obtained by the voltage division of the second voltage-dividing circuit may be applied to the second input terminal.

In doing so, it is possible to adjust voltages to be applied to the first element and the second element, by dividing them using the respective first voltage-dividing circuit and second voltage-dividing circuit. Furthermore, it is possible to adjust the magnitude of a current to be detected between a first conduction path and a second conduction path.

Embodiment 1

Hereinafter, Embodiment 1 of the present disclosure will be described.

Figure 1:
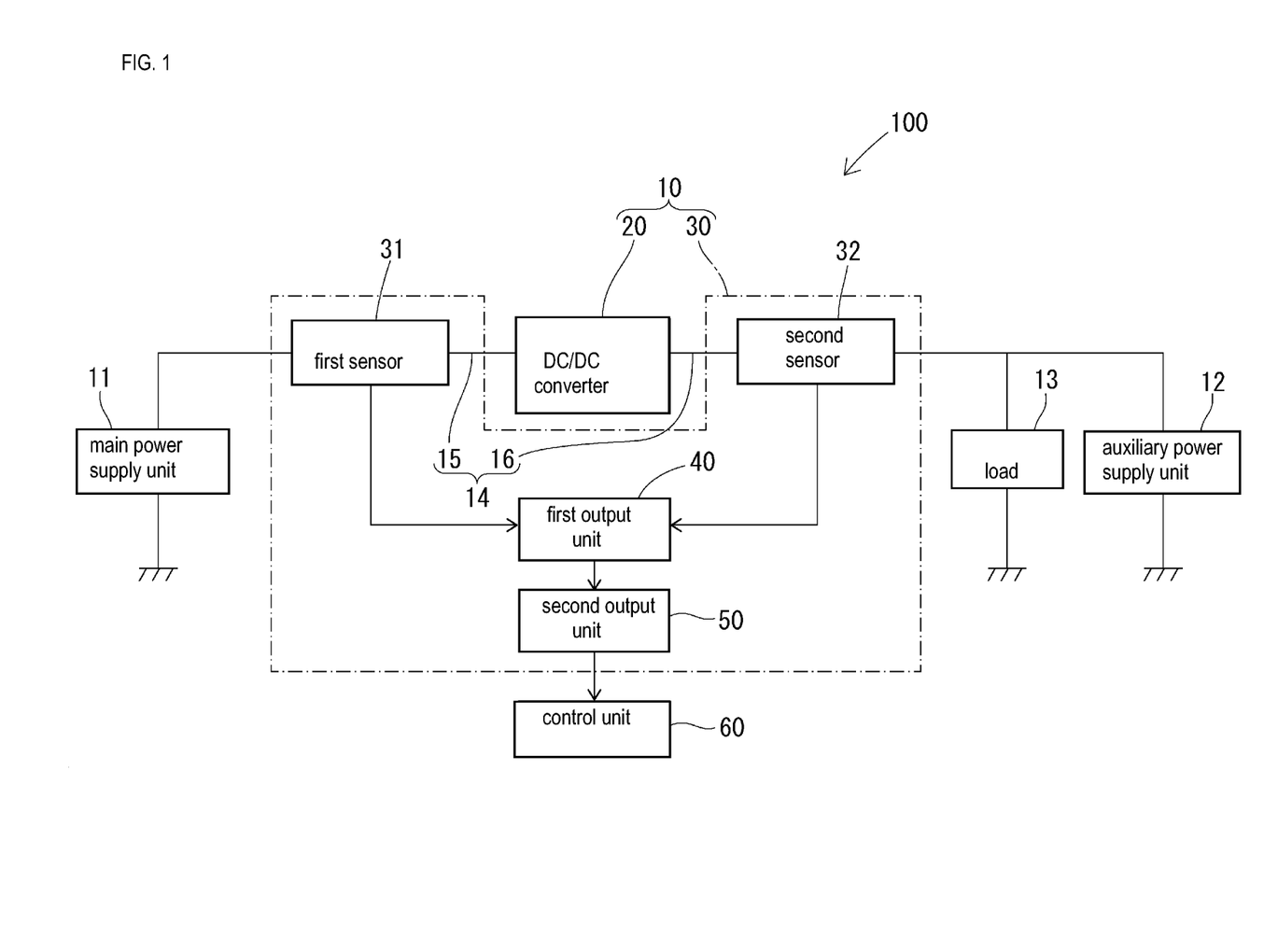
FIG. 1 is a block diagram schematically illustrating an example of a configuration of an on-board power supply system according to Embodiment 1.

An on-board power supply system 100 (hereinafter, also referred to as "system 100") shown in FIG. 1 is configured as a power supply system that supplies electric power to an on-board load 13 (hereinafter, also referred to as "load 13"). As shown in FIG. 1, the system 100 is provided with a main power supply unit 11, an auxiliary power supply unit 12, the load 13, an electric power path 14, a power supply device 10, a control unit, and the like. The main power supply unit 11 is a main power supply source for the load 13. The auxiliary power supply unit 12 is a power supply source different from the main power supply unit 11. The electric power path 14 is a path through which electric power is supplied between the main power supply unit 11, the auxiliary power supply unit 12, and the load 13. The power supply device 10 includes an on-board DC/DC converter 20 (hereinafter, also referred to as "DC/DC converter 20"), a current detection circuit 30, and the control unit 60. The DC/DC converter 20 is provided on the electric power path 14. The current detection circuit 30 detects a current flowing through the DC/DC converter 20. The control unit 60 controls operations of the DC/DC converter 20, the current detection circuit 30, and the like. In the system 100, for example, if power supply from the main power supply unit 11 is in a normal state, power is supplied from the main power supply unit 11 to the load 13 and the auxiliary power supply unit 12, and if power supply from the main power supply unit 11 is in an abnormal state, power is supplied from the auxiliary power supply unit 12 to the load 13 and the main power supply unit 11.

The main power supply unit 11 and the auxiliary power supply unit 12 are configured by, for example, a well-known electric power storage means such as a lead storage battery, a lithium-ion battery, an electric double-layer capacitor, a lithium-ion capacitor, or another electric power storage unit. The high potential-side terminals of the main power supply unit 11 and the auxiliary power supply unit 12 are electrically connected to the electric power path 14, and apply an output voltage of a predetermined value (for example, 12V) to the electric power path 14. The low potential-side terminals of the main power supply unit 11 and the auxiliary power supply unit 12 are electrically connected to a ground part provided in a vehicle. Furthermore, the main power supply unit 11 is electrically connected to a not-shown power generator, and can be charged with electric power from this power generator.

The load 13 is configured as a well-known on-board electric component. The load 13 is, for example, an ECU or an actuator in a shift-by-wire system, an ECU or an actuator in an electronic control brake system, or the like. The load 13 operates based on power supplied from the main power supply unit 11 in the above-described normal state, whereas the load 13 operates based on power supplied from the auxiliary power supply unit 12 in the above-described abnormal state.

The DC/DC converter 20 is configured as a well-known DC/DC converter, and the DC/DC converter 20 is provided, as shown in FIG. 1, at a position on the electric power path 14 between the main power supply unit 11, and the auxiliary power supply unit 12 and the load 13. The electric power path 14 is constituted by a first conduction path 15 and a second conduction path 16. One end of the first conduction path 15 is connected to the main power supply unit 11, and the other end of the first conduction path 15 is connected to the DC/DC converter 20. One end of the second conduction path 16 is connected to the DC/DC converter 20, and the other end of the second conduction path 16 is connected to the auxiliary power supply unit 12. The DC/DC converter 20 is configured to step-up or step-down a DC voltage applied to an input-side conduction path and output the resultant DC voltage to an output-side conduction path, while taking one of the first conduction path 15 and the second conduction path 16 as the input-side conduction path and the other one as the output-side conduction path.

Figure 2:
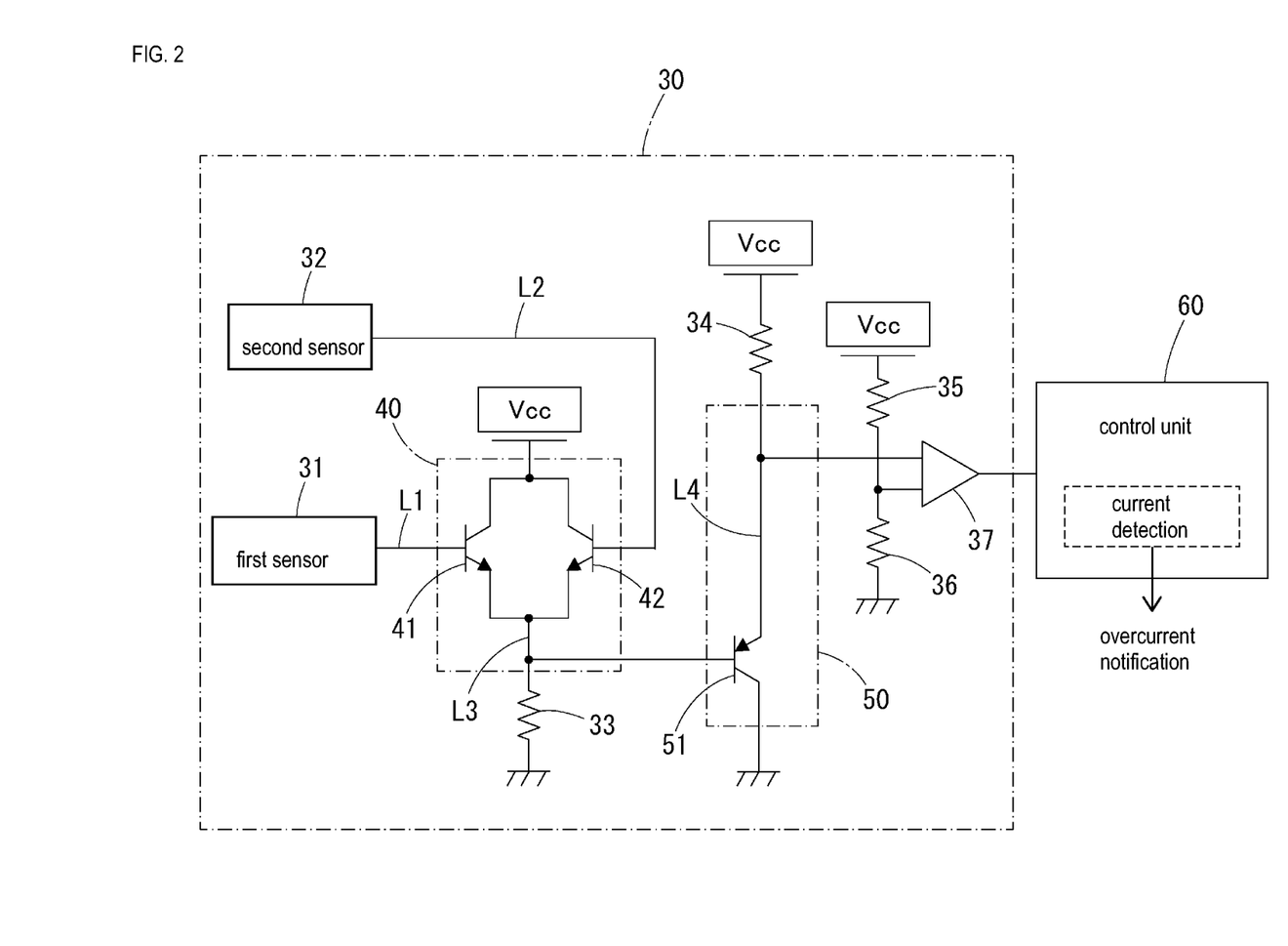
FIG. 2 is a circuit diagram schematically illustrating an example of a configuration of a current detection circuit of Embodiment 1.

As shown in FIG. 1, the current detection circuit 30 is provided on the electric power path 14, and functions to detect a current flowing through the DC/DC converter 20. As shown in FIG. 2, the current detection circuit 30 is provided with a first sensor 31, a second sensor 32, a first signal path L1, a second signal path L2, a first output unit 40, a second output unit 50, resistors 33 to 36, a comparator 37, and the like.

As shown in FIG. 1, the first sensor 31 is provided on the first conduction path 15. The first sensor 31 functions to output a first voltage that corresponds to a current flowing through the first conduction path 15. The first sensor 31 includes, for example, a resistor and a differential amplifier, and outputs a value indicating a current flowing through the first conduction path 15 (specifically, an analog voltage that corresponds to the value of the current flowing through the first conduction path 15). A voltage drop that occurs at the resistor due to a current flowing through the first conduction path 15 is amplified by the differential amplifier, and is output as a detected voltage (analog voltage) that corresponds to the output current.

As shown in FIG. 2, one end of the first signal path L1 is connected to the first sensor 31, and the other end of the first signal path L1 is connected to the base of a later-described transistor 41. The first voltage output by the first sensor 31 is applied to the first signal path L1.

As shown in FIG. 1, the second sensor 32 is provided on the second conduction path 16. The second sensor 32 functions to output a second voltage that corresponds to a current flowing through the second conduction path 16. The second sensor 32 includes, for example, a resistor and a differential amplifier, and outputs a value indicating a current flowing through the second conduction path 16 (specifically, an analog voltage that corresponds to the value of the current flowing through the second conduction path 16). A voltage drop that occurs at the resistor due to a current flowing through the second conduction path 16 is amplified by the differential amplifier, and is output as a detected voltage (analog voltage) that corresponds to the output current.

As shown in FIG. 2, one end of the second signal path L2 is connected to the second sensor 32, and the other end of the second signal path L2 is connected to the base of a later-described transistor 42. The second voltage output by the second sensor 32 is output to the second signal path L2.

As shown in FIG. 2, the first output unit 40 includes the transistor 41, the transistor 42, and a third signal path L3. The transistor 41 corresponds to an example of the first element, and is configured as an NPN bipolar transistor. The transistor 41 has a base, a collector, and an emitter. The base of the transistor 41 corresponds to an example of the first input terminal, and is connected to the other end of the first signal path L1. The collector of the transistor 41 is connected to a constant-voltage source Vcc and the collector of the transistor 42. The emitter of the transistor 41 corresponds to an example of the first output terminal, and is connected to one end of the third signal path L3 and the emitter of the transistor 42.

As shown in FIG. 2, the transistor 42 corresponds to an example of the second element, and is configured as an NPN bipolar transistor. The transistor 42 has a base, a collector, and an emitter. The base of the transistor 42 corresponds to an example of the second input terminal, and is connected to the other end of the second signal path L2. The collector of the transistor 42 is connected to the constant-voltage source Vcc and the collector of the transistor 41. The emitter of the transistor 42 corresponds to an example of the second output terminal, and is connected to the one end of the third signal path L3 and the emitter of the transistor 41.

As shown in FIG. 2, the one end of the third signal path L3 is connected to the emitter of the transistor 41 and the emitter of the transistor 42, and the other end of the third signal path L3 is connected to one end of the resistor 33. Furthermore, an end of a signal path branched from the third signal path L3 is connected to the base of a later-described transistor 51.

The first output unit 40 functions to apply, to the third signal path L3, a voltage that corresponds to an output from a detection sensor, which has detected the larger current, out of the first sensor 31 and the second sensor 32. Here, "detection sensor" refers to the sensor connected to a detection-target conduction path, the detection-target conduction path being the first conduction path 15 or the second conduction path 16 through which a larger current flows.

The one end of the resistor 33 is connected to the third signal path L3, and the other end of the resistor 33 is electrically connected to the ground.

As shown in FIG. 2, the second output unit 50 is connected to an end of the signal path branched from the third signal path L3. The second output unit 50 includes the transistor 51 and a fourth signal path L4. The transistor 51 corresponds to an example of the third element, and is configured as a PNP bipolar transistor. The transistor 51 has a base, a collector, and an emitter. The base of the transistor 51 corresponds to an example of the third input terminal, and is connected to the end of the signal path branched from the third signal path L3. The collector of the transistor 51 is electrically connected to the ground. The emitter of the transistor 51 corresponds to an example of the third output terminal, and is connected to the fourth signal path L4.

As shown in FIG. 2, one end of the fourth signal path L4 is connected to the emitter of the transistor 51, and the other end of the fourth signal path L4 is connected to one end of the resistor 34. A signal path branched from the fourth signal path L4 is connected to the positive-side input terminal of the later-described comparator 37.

As shown in FIG. 2, the one end of the resistor 34 is connected to the other end of the fourth signal path L4, and the other end of the resistor 34 is connected to a constant-voltage source Vcc.

The comparator 37 is configured as a well-known comparator. The positive-side input terminal of the comparator 37 is connected to the other end of the fourth signal path L4. Furthermore, an output voltage of a constant-voltage source Vcc is divided by the resistors 35 and 36, and the resultant voltage is input to the negative-side input terminal of the comparator 37. Specifically, the negative-side input terminal of the comparator 37 is electrically connected to one end of the resistor 35 the other end of which is connected to the constant-voltage source Vcc, and to one end of the resistor 36 the other end of which is connected to the ground. Furthermore, the output terminal of the comparator 37 is connected to the control unit 60. The comparator 37 outputs a predetermined high-level signal when a voltage applied to the positive-side input terminal is larger than a voltage (threshold) applied to the negative-side input terminal. On the other hand, the comparator 37 outputs a predetermined low-level signal when a voltage applied to the positive-side input terminal is less than the voltage (threshold) applied to the negative-side input terminal.

The control unit 60 is a component that controls operations of the current detection circuit 30, the DC/DC converter 20, and the like. The control unit 60 is configured as a microcomputer for example, and includes an arithmetic device such as a CPU, a memory such as a ROM or a RAM, and the like. The control unit 60 operates with electric power supplied from the main power supply unit 11 or the auxiliary power supply unit 12. The control unit 60 determines, based on a signal output from the current detection circuit 30, whether or not an overcurrent has occurred in the first conduction path 15 or the second conduction path 16 due to an earth fault or the like. Specifically, if a high-level signal is output from the comparator 37, the control unit 60 determines that an overcurrent has occurred in the first conduction path 15 or the second conduction path 16. On the other hand, if a low-level signal is output from the comparator 37, the control unit 60 determines that no overcurrent has occurred in the first conduction path 15 and the second conduction path 16. Note that, if it is determined that an overcurrent has occurred in the first conduction path 15 or the second conduction path 16, the control unit 60 may also give a predetermined failure notification (perform control to give voice-guided notification, for example).

The following will describe current detection operation performed by the current detection circuit 30.

The control unit 60 controls the DC/DC converter 20 to step-up or step-down a voltage applied to the input-side conduction path (one of the first conduction path 15 and the second conduction path 16) and output the resultant voltage to the output-side conduction path (the other one of the first conduction path 15 and the second conduction path 16). Then, the first sensor 31 detects a current flowing through the first conduction path 15, and applies a voltage (first voltage) that corresponds to the detected current to the first signal path L1. Similarly, the second sensor 32 detects a current flowing through the second conduction path 16, and applies a voltage (second voltage) that corresponds to the detected current to the second signal path L2. The first voltage applied to the first signal path L1 and the second voltage applied to the second signal path L2 are input to the first output unit 40.

The first output unit 40 applies, to the third signal path L3, a voltage that corresponds to the output from a detection sensor, which has detected the larger current, out of the first sensor 31 and the second sensor 32. Also, the first output unit 40 applies, to the third signal path L3, a voltage obtained by reflecting a voltage drop at the transistor 41 or the transistor 42 that is connected to the detection sensor, in the voltage output from the detection sensor. In other words, the larger one of the first voltage and the second voltage is applied to the third signal path L3, with a voltage drop that occurred at the transistor to which it was applied reflected therein.

The second output unit 50 applies, to the fourth signal path L4, a voltage obtained by reflecting a voltage drop that occurs between the base and the emitter of the transistor 51, in the voltage applied to the third signal path L3. Accordingly, that portion of the voltage applied to the base of the transistor 51 that corresponds to the voltage drop at the transistor 41 or the transistor 42 can be cancelled out by the voltage drop at the transistor 51. Thus, a current flowing through the first conduction path 15 or the second conduction path 16 can be detected based on a voltage applied to the fourth signal path L4, without being affected by a voltage drop that occurs at the transistor 41 or the transistor 42.

The voltage applied to the fourth signal path L4 is applied to the positive-side input terminal of the comparator 37. Then, the comparator 37 compares the voltage applied to the positive-side input terminal with the voltage applied to the negative-side input terminal, and outputs a comparison result to the control unit 60. The control unit 60 determines, based on the comparison result output from the comparator 37, whether or not an overcurrent has occurred in the first conduction path 15 or the second conduction path 16.

As described above, the current detection circuit 30 can detect currents flowing in different directions through the first conduction path 15 and the second conduction path 16 connected to the DC/DC converter 20, because the first sensor 31 and the second sensor 32 respectively detect the currents flowing through the first conduction path 15 and the second conduction path 16. Specifically, in the normal state (in which electric power is supplied from the main power supply unit 11 to the load 13 and the auxiliary power supply unit 12), a current flowing through the first conduction path 15 from the main power supply unit 11 toward the DC/DC converter 20 can be detected by the first sensor 31, and a current flowing through the second conduction path 16 from the DC/DC converter 20 toward the load 13 and the auxiliary power supply unit 12 can be detected by the second sensor 32. Accordingly, the currents flowing from the main power supply unit 11 toward the load 13 and the auxiliary power supply unit 12 can be detected on the first conduction path 15 and the second conduction path 16. On the other hand, in the abnormal state (in which electric power is supplied from the auxiliary power supply unit 12 to the load 13 and the main power supply unit 11), a current flowing through the first conduction path 15 from the DC/DC converter 20 toward the main power supply unit 11 is detected by the first sensor 31, and a current flowing through the second conduction path 16 from the auxiliary power supply unit 12 toward the DC/DC converter 20 can be detected by the second sensor 32. Accordingly, the currents flowing from the auxiliary power supply unit 12 toward the load 13 and the main power supply unit 11 can be detected on the first conduction path 15 and the second conduction path 16. Accordingly, it is possible to reduce the number of constituent components, compared to a configuration in which separate current detection circuits are provided for the first conduction path 15 and the second conduction path 16.

Furthermore, the current detection circuit 30 is configured to cancel out the portion that corresponds to a voltage drop that occurs at the transistor 41 or the transistor 42, using a voltage drop that occurs at the transistor 51. Accordingly, for example, by configuring the transistor 41 and the transistor 42 as being complementary to each other, a temperature change caused by a voltage drop that occurs at the transistor 41 or the transistor 42 can be cancelled out by a temperature change caused by a voltage drop that occurs at the transistor 51. Accordingly, the current detection circuit 30 can accurately detect currents, without being affected by the temperature characteristics of the transistor 41 or the transistor 42.

The following will describe examples of effects of the present configuration.

In the above-described current detection circuit 30, the first output unit 40 applies, to the third signal path L3, a voltage that corresponds to an output from a detection sensor, which has detected the larger current, out of the first sensor 31 and the second sensor 32. Accordingly, a voltage that corresponds to the current of the conduction path through which a larger current flows, out of the first conduction path 15 and the second conduction path 16 connected to the DC/DC converter 20, can be applied to the third signal path L3.

Also, the first output unit 40 applies, to the third signal path L3, a voltage obtained by reflecting a voltage drop at the transistor 41 or the transistor 42 that is connected to the detection sensor, in the voltage output from the detection sensor. Furthermore, the second output unit 50 applies, to the fourth signal path L4, a voltage obtained by reflecting a voltage drop that occurs between the base and the emitter of the transistor 51, in the voltage applied to the third signal path L3. Accordingly, that portion of the voltage applied to the base of the transistor 51 that corresponds to a voltage drop at the transistor 41 or the transistor 42 can be cancelled out by a voltage drop at the transistor 51. Thus, a current flowing through the first conduction path 15 or the second conduction path 16 can be detected based on a voltage applied to the fourth signal path L4, without being affected by a voltage drop that occurs at the element.

This current detection circuit 30 can detect currents flowing in different directions through the first conduction path 15 and the second conduction path 16 connected to the DC/DC converter 20, because the first sensor 31 and the second sensor 32 respectively detect the currents flowing through the first conduction path 15 and the second conduction path 16. Accordingly, it is possible to reduce the number of constituent components, compared to a configuration in which separate current detection circuits 30 are provided for the first conduction path 15 and the second conduction path 16.

Moreover, a temperature change caused by a voltage drop that occurs at the transistor 41 or the transistor 42 can be cancelled out by a temperature change caused by a voltage drop that occurs at the transistor 51. Accordingly, a current can be accurately detected, without being affected by the temperature characteristics of the transistor 41 or the transistor 42.

Embodiment 2

Hereinafter, Embodiment 2 will be described.

Figure 3:
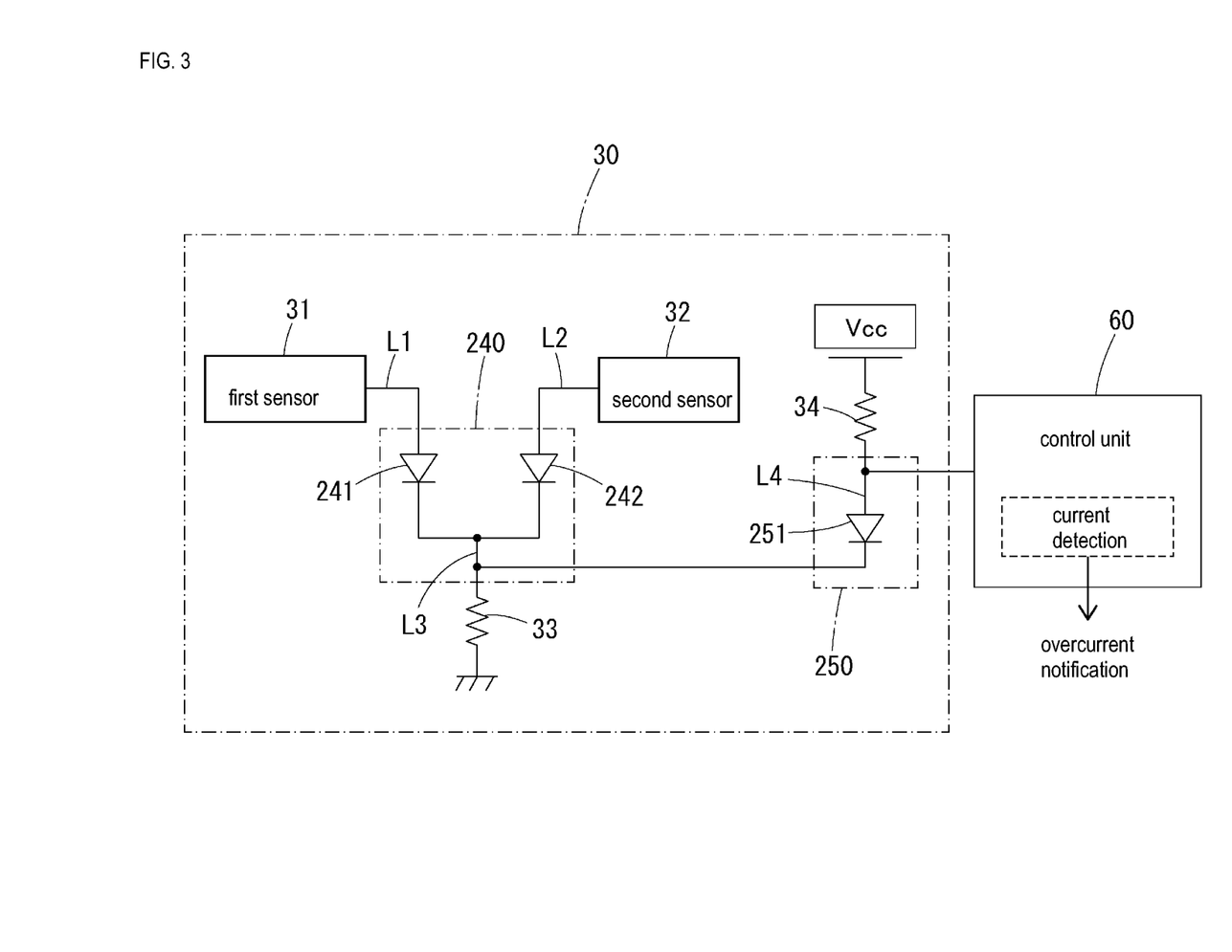
FIG. 3 is a circuit diagram schematically illustrating an example of a configuration of a current detection circuit according to Embodiment 2.

The system 100 according to Embodiment 2 mainly differs from that of Embodiment 1 in configurations of a first output unit 240 and a second output unit 250 of the current detection circuit 30. Note that configurations other than those are the same as those in Embodiment 1. Accordingly, in the following, the same reference numerals as those of Embodiment 1 are given to portions having the same configurations as those of Embodiment 1 and detailed descriptions thereof are omitted, and Embodiment 2 will be described focusing on the differences from the Embodiment 1.

As shown in FIG. 3, the current detection circuit 30 of Embodiment 2 is provided with the first sensor 31, the second sensor 32, the first signal path L1, the second signal path L2, the first output unit 240, the second output unit 250, the resistors 33 to 36, the comparator 37, and the like. The first output unit 240 includes a diode 241, a diode 242, and the third signal path L3. The diode 241 corresponds to an example of the first element, and has an anode and a cathode. The anode of the diode 241 corresponds to an example of the first input terminal, and is connected to the other end of the first signal path L1. The cathode of the diode 241 corresponds to an example of the first output terminal, and is connected to the one end of the third signal path L3 and the cathode of the diode 242.

As shown in FIG. 3, the diode 242 corresponds to an example of the second element, and has an anode and a cathode. The anode of the diode 242 corresponds to an example of the second input terminal, and is connected to the other end of the second signal path L2. The cathode of the diode 242 corresponds to an example of the second output terminal, and is connected to the one end of the third signal path L3 and the cathode of the diode 241.

As shown in FIG. 3, the one end of the third signal path L3 is connected to the cathode of the diode 241 and the cathode of the diode 242, and the other end of the third signal path L3 is connected to the one end of the resistor 33. Furthermore, an end of a signal path branched from the third signal path L3 is connected to the cathode of a later-described diode 251.

As shown in FIG. 3, the second output unit 250 is connected to the end of the signal path branched from the third signal path L3. The second output unit 250 includes a diode 251 and the fourth signal path L4. The diode 251 corresponds to an example of the third element, and has an anode and a cathode. The cathode of the diode 251 corresponds to an example of the third input terminal, and is connected to the end of the signal path branched from the third signal path L3. The anode of the diode 251 corresponds to an example of the third output terminal, and is connected to the fourth signal path L4.

As shown in FIG. 3, the one end of the fourth signal path L4 is connected to the anode of the diode 251, and the other end of the fourth signal path L4 is connected to the one end of the resistor 34. A signal path branched from the fourth signal path L4 is connected to the control unit 60.

The control unit 60 determines, based on a voltage signal output to the fourth signal path L4, whether or not an overcurrent has occurred in the first conduction path 15 or the second conduction path 16 due to an earth fault or the like. For example, the control unit 60 compares a voltage applied to the fourth signal path L4 with a predetermined threshold, and determines that an overcurrent has occurred in the first conduction path 15 or the second conduction path 16 if the voltage applied to the fourth signal path L4 is larger than the predetermined threshold. On the other hand, the control unit 60 determines that no overcurrent has occurred in the first conduction path 15 and the second conduction path 16 if the voltage applied to the fourth signal path L4 is less than the predetermined threshold.

The following will describe a current detection operation performed by the current detection circuit 30.

Similar to Embodiment 1, the first output unit 240 applies, to the third signal path L3, a voltage that corresponds to an output from a detection sensor, which has detected the larger current, out of the first sensor 31 and the second sensor 32. Also, the first output unit 240 applies, to the third signal path L3, a voltage obtained by reflecting a voltage drop at the diode 241 or the diode 242 that is connected to the detection sensor, in the voltage output from the detection sensor. In other words, the larger one of the first voltage and the second voltage is applied to the third signal path L3, with a voltage drop that occurred at the diode to which it was applied reflected therein.

The second output unit 250 applies, to the fourth signal path L4, a voltage obtained by reflecting a voltage drop that occurs between the anode and the cathode of the diode 251, in the voltage applied to the third signal path L3. Accordingly, that portion of the voltage applied to the cathode of the diode 251 that corresponds to a voltage drop at the diode 241 or the diode 242 can be cancelled out by a voltage drop at the diode 251. Therefore, a current flowing through the first conduction path 15 or the second conduction path 16 can be detected based on a voltage applied to the fourth signal path L4, without being affected by a voltage drop that occurs at the diode 241 or the diode 242.

The voltage applied to the fourth signal path L4 is input to the control unit 60 as a voltage signal. Then, the control unit 60 compares the voltage of the input signal with the predetermined threshold, and determines whether or not an overcurrent has occurred in the first conduction path 15 or the second conduction path 16.

As described above, the current detection circuit 30 of Embodiment 2 can detect currents flowing in different directions through the first conduction path 15 and the second conduction path 16 connected to the DC/DC converter 20, because the first sensor 31 and the second sensor 32 respectively detect the currents flowing through the first conduction path 15 and the second conduction path 16. Accordingly, it is possible to reduce the number of constituent components, compared to a configuration in which separate current detection circuits are provided for the first conduction path 15 and the second conduction path 16.

Furthermore, the current detection circuit 30 can cancel out that portion of a voltage applied to the cathode of the diode 251 that corresponds to a voltage drop at the diode 241 or the diode 242, using a voltage drop at the diode 251. Accordingly, a current flowing through the first conduction path 15 or the second conduction path 16 can be detected based on a voltage applied to the fourth signal path L4, without being affected by a voltage drop that occurs at the element.

Furthermore, the current detection circuit 30 can cancel out a temperature change caused by a voltage drop that occurs at the diode 241 or the diode 242, using a temperature change caused by a voltage drop that occurs at the diode 251. Accordingly, the current detection circuit 30 can accurately detect currents without being affected by the temperature characteristics of the diode 241 or the diode 242.

Embodiment 3

Hereinafter, Embodiment 3 will be described.

Figure 4:
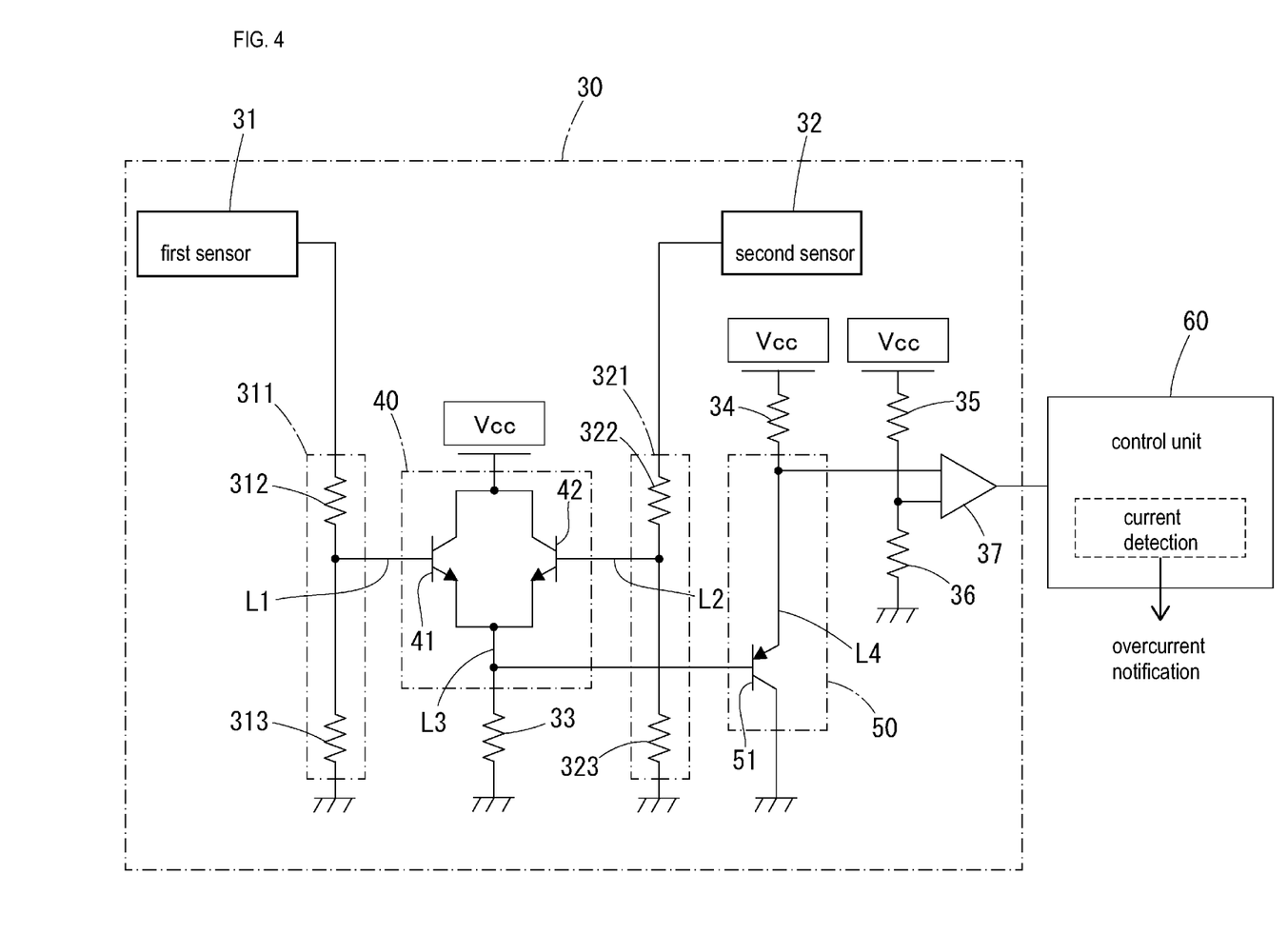
FIG. 4 is a circuit diagram schematically illustrating an example of a configuration of a current detection circuit according to Embodiment 3.

The system 100 according to Embodiment 3 mainly differs from that of Embodiment 1 in that a first voltage-dividing circuit 311 is provided between the first sensor 31 and the first signal path L1, and a second voltage-dividing circuit 321 is provided between the second sensor 32 and the second signal path L2. Note that configurations other than those are the same as those in Embodiment 1. Accordingly, in the following, the same reference numerals as those of Embodiment 1 are given to portions having the same configurations as those of Embodiment 1 and detailed descriptions thereof are omitted, and Embodiment 3 will be described focusing on the differences from the Embodiment 1.

As shown in FIG. 4, the current detection circuit 30 of Embodiment 3 is provided with the first sensor 31, the second sensor 32, the first voltage-dividing circuit 311, the second voltage-dividing circuit 321, the first signal path L1, the second signal path L2, the first output unit 40, the second output unit 50, the resistors 33 to 36, the comparator 37, and the like. The first voltage-dividing circuit 311 includes a resistor 312 and a resistor 313. One end of the resistor 312 is connected to the first sensor 31, and the other end of the resistor 312 is connected to the one end of the first signal path L1 and one end of the resistor 313. The one end of the resistor 313 is connected to the other end of the resistor 312 and the one end of the first signal path L1, and the other end of the resistor 313 is electrically connected to ground. The first voltage-dividing circuit 311 functions to divide a first voltage applied by the first sensor 31, and apply the divided voltage to the first signal path L1. The first voltage divided by the first voltage-dividing circuit 311 is applied to the base of the transistor 41.

The second voltage-dividing circuit 321 includes a resistor 322 and a resistor 323. One end of the resistor 322 is connected to the second sensor 32, and the other end of the resistor 322 is connected to the one end of the second signal path L2 and one end of the resistor 323. One end of the resistor 323 is connected to the other end of the resistor 322 and the one end of the second signal path L2, and the other end of the resistor 323 is electrically connected to ground. The second voltage-dividing circuit 321 functions to divide a second voltage applied by the second sensor 32, and apply the divided voltage to the second signal path L2. The second voltage divided by the second voltage-dividing circuit 321 is applied to the base of the transistor 42.

According to the configuration of the current detection circuit 30 of Embodiment 3, voltages to be applied to the transistor 41 and the transistor 42 can be adjusted, by being respectively divided by the first voltage-dividing circuit 311 and the second voltage-dividing circuit 321. Therefore, it is possible to reduce voltages to be applied to the third signal path L3 and the fourth signal path L4 to desired magnitudes of voltages. Therefore, a predetermined threshold with which the comparator 37 compares a voltage applied to the fourth signal path L4 can be reduced to a desired magnitude. Furthermore, by employing a configuration in which the first voltage-dividing circuit 311 and the second voltage-dividing circuit 321 perform voltage division with different voltage dividing ratios, it is possible to adjust the degrees of magnitudes of detected currents, between the first conduction path and the second conduction path.

Figure 7:
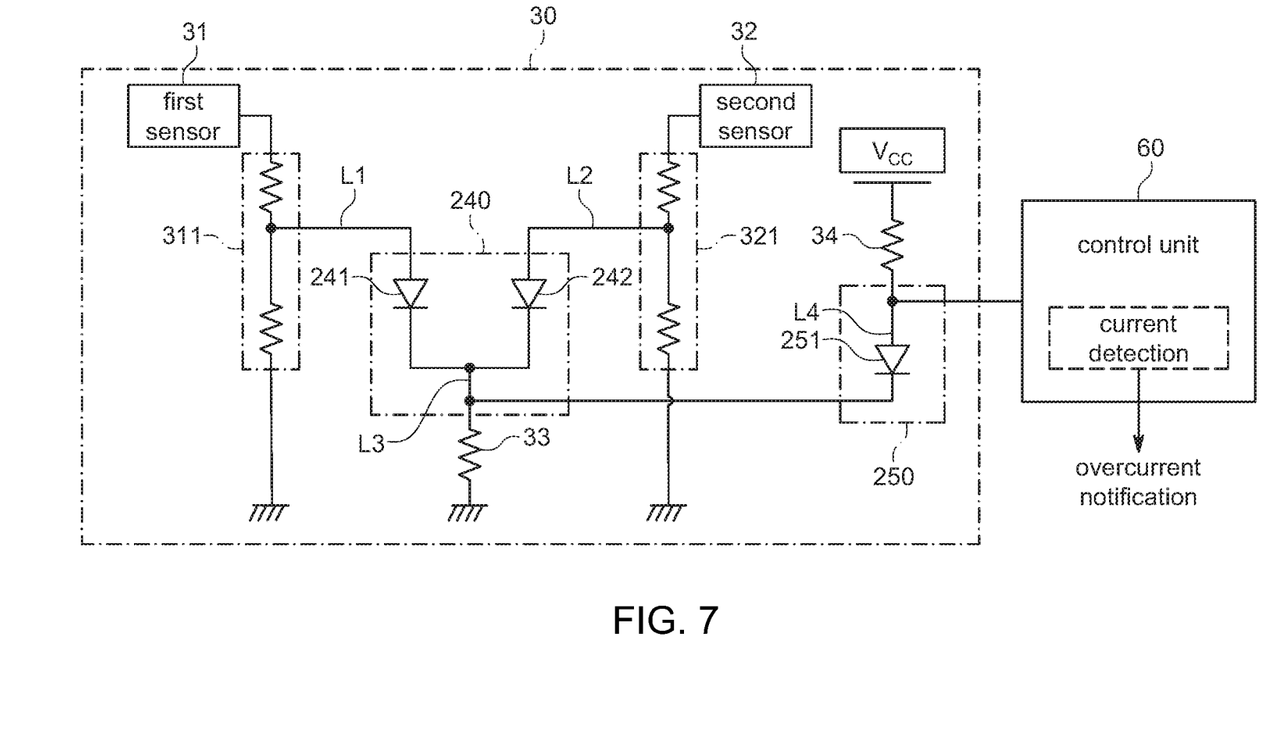
FIG. 7 is a circuit diagram schematically illustrating a current detection circuit detection circuit according to another aspect of Embodiment 3.

In another aspect, as shown in FIG. 7, the first element is diode 241, the second element is diode 242 and the third element is diode 251 each having an input terminal and an output terminal which is the anode and cathode of the respective diodes 241, 242, 251. A first voltage-dividing circuit 311 is configured to divide the first voltage applied by the first sensor 31. A second voltage-dividing circuit 321 is configured to divide the second voltage applied by the second sensor 32, wherein a voltage obtained by the division of the first voltage-dividing circuit 311 is applied to the first input terminal of diode 241, and a voltage obtained by the division of the second voltage-dividing circuit 321 is applied to the second input terminal of diode 251.

Other Embodiments

The present disclosure is not limited to the above-described embodiments explained with reference to the description above and the drawings, and the technical scope of the present disclosure also encompasses the following embodiments for example.

In Embodiments 1 to 3, a configuration is also possible in which, in the current detection circuit 30, a constant current circuit is connected to the first signal path L1, so that a constant current will flow through the first signal path L1 when an overcurrent occurs in the first conduction path 15 or the second conduction path 16. With this measure, a voltage to be applied to the fourth signal path L4 can be stabilized, making it possible to accurately detect a current.

Embodiments 1 and 3 employ a configuration in which a voltage applied to the fourth signal path L4 is compared and determined by the comparator 37, but may also employ a configuration in which, similar to Embodiment 2, comparison and determination are performed by the control unit 60, instead of being performed by the comparator 37. Furthermore, Embodiment 2 may also employ, similar to Embodiments 1 and 3, a configuration in which a voltage applied to the fourth signal path L4 is compared and determined by the comparator 37.

In Embodiments 1 to 3, the control unit 60 is mainly configured by a microcomputer but may also be realized by a plurality of hardware circuits other than a microcomputer.

What is claimed is:

1. A current detection circuit for detecting a current flowing through an on-board DC/DC converter electrically connected to a first conduction path and a second conduction path, the DC/DC converter being configured to step-up or step-down a voltage applied to an input-side conduction path and output the resultant voltage to an output-side conduction path, while taking one of the first conduction path and the second conduction path as the input-side conduction path and the other one as the output-side conduction path, the current detection circuit comprising:
a first sensor configured to output a first voltage that corresponds to a current flowing through the first conduction path;
a first signal path to which an alpha voltage that corresponds to the first voltage is applied;
a second sensor configured to output a second voltage that corresponds to a current flowing through the second conduction path;
a second signal path to which a beta voltage that corresponds to the second voltage is applied;
a first output unit including a first element and a second element, the first element having a first input terminal connected to the first signal path, and a first output terminal; the second element having a second input terminal connected to the second signal path, and a second output terminal; and a third signal path connected to the first output terminal and the second output terminal, the first output unit being configured to apply, to the third signal path, a zeta voltage that corresponds to an output from a detection sensor, which has detected a larger current, out of the first sensor and the second sensor; and
a second output unit including a third element having a third input terminal connected to the third signal path, and a third output terminal and a fourth signal path connected to the third output terminal,
wherein the first output unit applies, to the third signal path, an eta voltage obtained by reflecting a voltage drop at the first element or the second element that is connected to the detection sensor, in the voltage output from the detection sensor, and
the second output unit applies, to the fourth signal path, a theta voltage obtained by reflecting another voltage drop that occurs between the third input terminal and the third output terminal of the third element, in the voltage applied to the third signal path and wherein a temperature change caused by a voltage drop that occurs at the first and second elements is cancelled out by a temperature change caused by a voltage drop at the third element so as to detect the current flowing through the on-board DC/DC converter without being affected by the temperature change at the first and second elements.

2. The current detection circuit according to claim 1, wherein the first element, the first input terminal, and the first output terminal are respectively configured as a bipolar transistor, a base, and an emitter,
the second element, the second input terminal, and the second output terminal are respectively configured as a bipolar transistor, a base, and an emitter, and
the third element, the third input terminal, and the third output terminal are respectively configured as a bipolar transistor, a base, and an emitter.

3. The current detection circuit according claim 2, further comprising:
a first voltage-dividing circuit configured to divide the first voltage applied by the first sensor; and
a second voltage-dividing circuit configured to divide the second voltage applied by the second sensor,
wherein a mu voltage obtained by the division of the first voltage-dividing circuit is applied to the first input terminal, and
a nu voltage obtained by the division of the second voltage-dividing circuit is applied to the second input terminal.

4. The current detection circuit according to claim 1, wherein the first element, the first input terminal, and the first output terminal are respectively configured as a diode, an anode, and a cathode,
the second element, the second input terminal, and the second output terminal are respectively configured as a diode, an anode, and a cathode, and
the third element, the third input terminal, and the third output terminal are respectively configured as a diode, a cathode, and an anode.

5. The current detection circuit according claim 4, further comprising:
a first voltage-dividing circuit configured to divide the first voltage applied by the first sensor; and a second voltage-dividing circuit configured to divide the second voltage applied by the second sensor, wherein a mu voltage obtained by the division of the first voltage-dividing circuit is applied to the first input terminal, and a nu voltage obtained by the division of the second voltage-dividing circuit is applied to the second input terminal.

6. The current detection circuit according claim 1, further comprising:

a first voltage-dividing circuit configured to divide the first voltage applied by the first sensor; and a second voltage-dividing circuit configured to divide the second voltage applied by the second sensor, wherein a mu voltage obtained by the division of the first voltage-dividing circuit is applied to the first input terminal, and a nu voltage obtained by the division of the second voltage-dividing circuit is applied to the second input terminal.

7. A power supply device comprising:

the on-board DC/DC converter; and the current detection circuit according to claim 1.

* * * * *